United States Patent [19]

Freyman et al.

[11] Patent Number: 5,801,558
[45] Date of Patent: Sep. 1, 1998

[54] CONTROLLED TRANSITION TIME DRIVER CIRCUIT

[75] Inventors: Ronald Lamar Freyman, Bethlehem; Paul David Hendricks, Whitehall; Richard Muscavage, Gilbertsville, all of Pa.

[73] Assignee: Lucent Technologies Inc., Murray Hill, N.J.

[21] Appl. No.: 757,059

[22] Filed: Nov. 26, 1996

Related U.S. Application Data

[60] Provisional application No. 60/007,893, Dec. 1, 1995.
[51] Int. Cl.$^6$ ................................................. H03K 17/16
[52] U.S. Cl. ........................... 327/112; 327/379; 327/108; 326/58
[58] Field of Search ............................. 327/108, 111, 327/112, 379, 380, 381, 383, 310, 427; 326/26, 27, 56, 57, 58

[56] References Cited

U.S. PATENT DOCUMENTS

| | | | |
|---|---|---|---|
| 4,751,410 | 6/1988 | Tanizawa | 326/56 |
| 5,120,992 | 6/1992 | Miller et al. | 327/111 |
| 5,430,335 | 7/1995 | Tanoi | 327/379 |
| 5,450,356 | 9/1995 | Miller | 326/58 |

Primary Examiner—Toan Tran
Attorney, Agent, or Firm—David L. Smith

[57] ABSTRACT

There is disclosed an integrated circuit includes an output driver circuit providing control of transition time from one state to another. The output driver includes first and second input transistors coupled to an input node at which data is received. First and second output transistors are coupled to an output node at which the data is presented when the output driver is enabled. The first input transistor is coupled to the first output transistor defining a first node. The second input transistor is coupled to the second output transistor defining a second node. First and second switching circuits are coupled between the first node and the second node. The first switching circuit is switchable between a first state that isolates the first node from the second node, and a second state that couples the first node to the second node. The first switching circuit exhibits a characteristic upon being switched from one of the first or second states to the other, such as from the first state to the second state, that impacts turn-on time of one of the first and second output transistors. The second switching circuit is switchable between a first state that isolates the first node from the second node, and a second state that couples the first node to the second node. The second switching circuit also exhibits a characteristic that upon being switched from one of the first and second states impacts turn-on time of the other of the first and second output transistors.

32 Claims, 3 Drawing Sheets

CONTROLLED TRANSITION TIME DRIVER CIRCUIT

This application claims benefit of U.S.C. Provisional Application Ser. No. 60/007.893, filed Dec. 1, 1995.

1. Technical Field

This invention relates generally to driver circuits, also known as buffers useful in integrated circuits, and more particularly to a driver circuit for transferring data between an integrated circuit and an internal or external bus, in which the driver circuit has controlled rise and fall times.

2. Background of the Invention

A driver circuit, sometimes called a three-state buffer or tri-state buffer, is a circuit used to control transfer of signals, typically logic signals such as data, from its input to its output. A typical application of a driver circuit is to drive data from an integrated circuit onto a conductor of a bus, or to isolate the input of the output driver circuit from the bus when data is not being driven onto the bus.

In microprocessors, such as digital signal processors, the transfer of data takes place over a common set of conductors known as a bus. Some buses are unidirectional and permit signals to flow in only one direction on the bus, whereas other buses are bidirectional and permit signals to flow in either direction on the bus. Many integrated circuits in a system have inputs and outputs tied to a bus. Integrated circuits coupled to a bus are coupled through an output driver circuit that may be separate therefrom, but more commonly is an integral part of the integrated circuit.

A driver circuit that is a three-state buffer allows three possible output states: high, low, and high impedance. In the high impedance state, the output is an open or floating terminal that, as seen by the bus conductor, is a high impedance to both ground and the power supply. Where multiple devices, such as integrated circuits, are coupled to a common bus, the driver circuit permits controlling the transmission of signals from any one of these devices over the bus to other such devices. The driver circuit associated with the device providing the signal will be enabled to permit signals to pass through and be driven onto a conductor of the associated bus. Other output buses coupled to the same conductor of the bus will be in a high impedance state, effectively disconnecting them from the bus. Some driver circuits invert the signal as it is driven onto the bus; other driver circuits drive a noninverted version of the signal onto the bus.

When data is being driven onto a conductor of a bus, the conductor of the bus changes state rapidly from a logic high to a logic low, or from a logic low to a logic high. Fall time is a transition of the bus conductor from a logic high state (also referred to as a logic high or high) to a logic low state (also referred to as a logic low or low). Rise time is a transition of the bus conductor from a logic low state to a logic high state. Previously rise and fall times were not controlled. The transitions took place as rapidly as the circuit output drive devices could switch states.

Transistors are switched from one state to another, such as from an on state to an off state, or from an off state to an on state, to achieve the state transition of the bus conductor. The load being driven is largely capacitive. Rapid rise and fall times, typically in the range of 0.25 nanoseconds, result in ringing as the state of the bus conductor is driven to its final state, overshoots, and settles in to its final value, whether a logic high or a logic low. Undesirable noise and current spikes are introduced. The current spikes cause undesirable and unnecessary consumption of power.

The rise and fall times, which are determined by the time required to turn on or off the pull-up output driver transistor and the pull-down output driver transistor, respectively, can vary due to variations in power supply voltage, operating temperature, and other parameters. In a driver circuit fabricated using complementary metal oxide semiconductors, the pull-up output driver transistor is typically a p-channel device, and the pull-down output driver transistor is typically an n-channel device.

One known solution to slowing down the rise and fall times to reduce current spikes is to employ a resistor in series with the output driver. While this solution slows the turning on and turning off of the pull-up and pull-down output driver transistors, it has the undesirable effect of consuming relatively large amounts of power.

Another known solution is to provide a plurality of output driver transistors that vary in size. The transistors are turned on sequentially, beginning with the smallest transistor, until either all of the drive transistors are turned on, or at least until a sufficient number of drive transistors are turned on to provide the desired drive current.

SUMMARY OF THE INVENTION

In accordance with an illustrative embodiment of the invention, an integrated circuit includes a driver circuit providing control of transition time from one state to another. The driver includes first and second input transistors coupled to an input node at which data is received. First and second output transistors are coupled to an output node at which the data is presented when the driver is enabled. The first input transistor is coupled to the first output transistor defining a first node. The second input transistor is coupled to the second output transistor defining a second node. First and second switching circuits are coupled between the first node and the second node. The first switching circuit is switchable between a first state that isolates the first node to the second node, and a second state that couples the first node from the second node. The first switching circuit exhibits a characteristic upon being switched from one of the first or second states to the other, such as from the first state to the second state, that impacts turn-on time of one of the first and second output transistors. The second switching circuit is switchable between a first state that isolates the first node from the second node, and a second state that couples the first node to the second node. The second switching circuit also exhibits a characteristic that upon being switched from one of the first and second states to the other, such as from the first state to the second state, impacts turn-on time of the other of the first and second output transistors.

DETAILED DESCRIPTION

Figure 1:
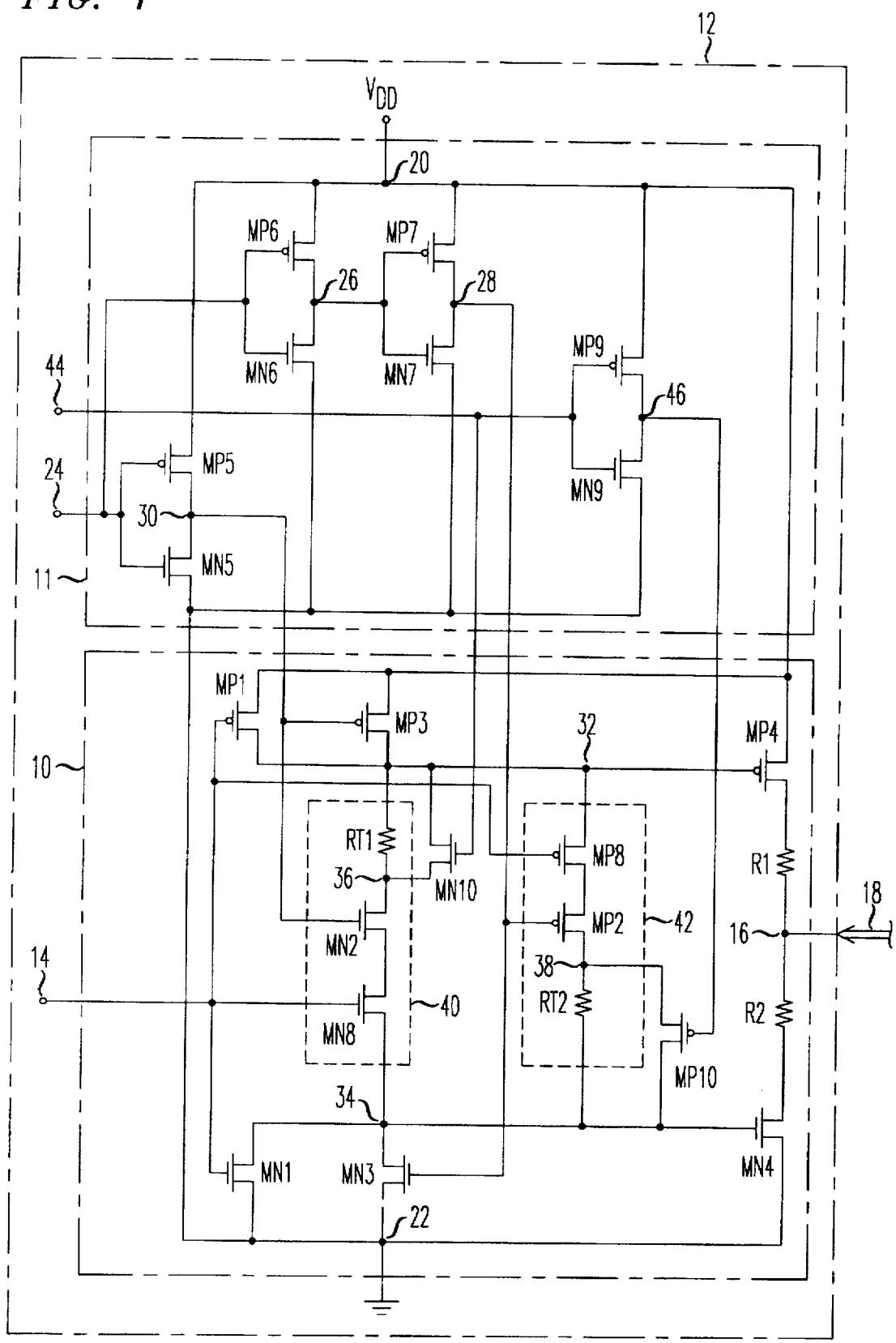
FIG. 1 is a schematic diagram of an integrated circuit including a controlled transition time driver circuit, in accordance with an illustrative embodiment of the invention.

FIG. 1 shows a schematic diagram of a driver circuit 10, known as a three-state driver, tri-state driver, buffer, or pad driver circuit, in accordance with an illustrative embodiment of the invention. Driver circuit 10, which may include control logic 11, is part of an integrated circuit 12; integrated circuit 12 may comprise several driver circuits 10. Driver circuit 10 provides a buffer between input node 14, which is the input to driver circuit 10, and output node 16, which is the output of driver circuit 10. Signals or data produced or processed on integrated circuit 12 are coupled (not shown) to input node 14 to be presented at output node 16 and driven onto a conductor of bus 18. The data is in the form of a sequence of high and low logic signals. Output node 16 is coupled to a pad (not shown) which in turn is coupled to a pin of the integrated circuit package (also not shown). The pin is adapted to couple to one conductor of a multi-conductor bus 18 when integrated circuit 12 is mounted on a circuit board (not shown). By transferring data presented at input node 14 from input node 14 to output node 16, data is transferred from integrated circuit 12 to a bus, such as bus 18.

The illustrative embodiment of the invention shown in FIG. 1 employs complementary metal oxide semiconductor transistors, however, the invention is not limited thereto. Driver circuit 10 includes P-channel transistors MP1, MP2, MP3, MP4, MP5, MP6, MP7, MP8, MP9, and MP10, as well as N-channel transistors MN1, MN2, MN3, MN4, MN5, MN6, MN7, MN8, MN9, and MN10.

Transistors MP5 and MN5, MP6 and MN6, MP7 and MN7, as well as MP9 and MN9 form control logic 11 and are coupled as inverters between a power node 20, which in turn is coupled to a power supply $V_{DD}$, and a reference potential 22, such as ground. The serially coupled conduction paths of the transistors in each transistor pair MP5, MN5; MP6, MN6; MP7, MN7; and MP9, MN9, are coupled between power node 20 and reference potential 22. The gate of each of transistors MN5, MP5, MN6 and MP6 is coupled to node 24. The drain of transistor MP6 is coupled to the drain of transistor MN6, defining node 26. The gates of transistors MP7 and MN7 are also coupled to node 26. The drain of transistor MP7 is coupled to the drain of transistor MN7, defining node 28. Similarly, the drain of transistor MP5 is coupled to the drain of transistor MN5, defining node 30. The gate of each of transistors MN9 and MP9 is coupled to node 44. The drain of transistor MP9 is coupled to the drain of transistor MN9, defining node 46.

Output driver transistors MP4 and MN4, which may be sized larger than the other transistors to source or sink current, are coupled between power node 20 and reference potential 22. The source of transistor MP4 is coupled to power node 20. Resistor R1 is coupled between the drain of transistor MP4 and output node 16. The gate of transistor MP4 is coupled to node 32. Resistor R2 is coupled between output node 16 and the drain of transistor MN4. The source of transistor MN4 is coupled to reference potential 22. The gate of transistor MN4 is coupled to node 34. Resistors R1 and R2 are impedance matching resistors, typically in the range of 30 ohms, to match a 50 ohm bus. Resistors R1 and R2 typically would not be present in a driver circuit application internal to integrated circuit 12.

The source of transistor MP1 is coupled to power node 20, the drain is coupled to node 32, and the gate is coupled to input node 14. The drain of transistor MN1 is coupled to node 34, the source is coupled to reference potential 22, and the gate is also coupled to input node 14.

The drain of transistor MN3 is coupled to node 34, the source is coupled to reference potential 22, and the gate is coupled to node 28. The source of transistor MP3 is coupled to power node 20, the drain is coupled to node 32, and the gate is coupled to node 30.

Coupled between nodes 32 and node 34 are first and second switching circuits 40 and 42. The first switching circuit 40 is comprised of resistor RT1 and transistor MN8, and may include transistor MN2. In the first switching circuit, resistor RT1 is coupled between node 32 and node 36. The drain of transistor MN2 is also coupled to node 36. The source of transistor MN2 is coupled to the drain of transistor MN8. The source of transistor MN8 is coupled to node 34. The gate of transistor MN2 is coupled to node 30. The gate of transistor MN8 is coupled to input node 14.

The second switching circuit 42 is coupled in parallel with first switching circuit 40 between nodes 32 and 34, and is comprised of resistor RT2 and transistor MP2, and may include transistor MP8. In the second switching circuit 42, resistor RT2 is coupled between node 34 and node 38. The drain of transistor MP2 is also coupled to node 38. The source of transistor MP2 is coupled to the drain of transistor MP8. The source of transistor MP8 is coupled to node 32. The gate of transistor MP2 is coupled to node 28. The gate of transistor MP8 is coupled to input node 14.

The conduction path of transistor MN10 is coupled between nodes 32 and 36, in parallel with resistor RT1. The gate of transistor MN10 is coupled to node 44. The conduction path of transistor MP10 is coupled between nodes 34 and 38, in parallel with resistor RT2. The gate of transistor MP10 is coupled to node 46. When transistors MN10 or MP10, or both, are switched to be in the on state, the respective resistor RT1 or RT2, or both, are effectively removed from the circuit due to the parallel path provided by the conduction path of the respective transistor MN10 or MP10.

In operation, driver circuit 10 is enabled and drives (passes) data presented at input node 14 to output node 16 and onto a conductor of bus 18 when a first logic state is presented at node 24. Driver circuit 10 is not enabled and isolates input node 14, and thus integrated circuit 12 from the conductor of bus 18 to which output node 16 is coupled, when a second logic state is presented at node 24. Typically the first logic state is a logic low and the second logic state is a logic high, however, a circuit could be designed to operate with the opposite logic states. When driver circuit 10 is coupled to drive data from integrated circuit 12 onto bus 18, but is not enabled, driver circuit 10 isolates input node 14 and integrated circuit 12 from the conductor of bus 18 to which output node 16 is coupled.

Node 44 provides the capability to switch operation of driver circuit 10 between operation in accordance with the present invention as a controlled transition time output driver circuit and operation as a conventional driver circuit. When a first logic state is presented at node 44, the resistance of resistors RT1 and RT2 is present in circuits 40 and 42 because transistors MN10 and MP10 are in the off state. Driver circuit 10 operates in accordance with the present invention as a controlled transition time output driver circuit. When a second logic state is presented at node 44, the resistance of resistors RT1 and RT2 is removed from circuits 40 and 42 because transistors MN10 and MP10 are in the on state. In this configuration, the controlled transition time aspect of the invention is bypassed and driver circuit 10 operates as a conventional driver circuit. In the illustrative embodiment of the invention shown in FIG. 1, the first logic state is a logic low and the second logic state is a logic high, however, a circuit could be designed to operate with the opposite logic states. One skilled in the art could adapt the bypass control circuit described above to the alternative illustrative embodiment shown in FIG. 3.

When a logic high is presented at node 24 to disable driver circuit 10, nodes 26 and 30 are a logic low and node 28 is a logic high. Node 30 being a logic low turns on transistor MP3 which pulls node 32 high, up to the potential of power node 20, which provides a logic high at the gate of transistor MP4, turning transistor MP4 off. The gate of transistor MN2 being a logic low turns transistor MN2 off isolating node 32 from node 34 through first switching circuit 40. Node 28 being a logic high turns transistor MP2 off isolating node 32 from node 34 through second switching circuit 42. Node 28 being second switching circuit 42. Node 28 being a logic high and also turns on transistor MN3 which pulls node 34 low, down to the potential of reference potential 22. A logic low at the gate of transistor MN4 turns transistor MN4 off. With transistor MP4 in the off state and transistor MN4 in the off state, driver circuit 10 operates as a three-state buffer in the high impedance state. Data presented at input node 14 is not transferred to output node 16, and thus is not driven onto a conductor of bus 18. Bus 18 is coupled by a high impedance to both the power node 20 and reference potential 22, without regard to the state of node 14 or the other transistors.

When enabled, one of the first or second switching circuits 40 or 42 is completed thereby coupling node 32 to node 34. In this configuration, driver circuit 10, between input node 14 and output node 16, is substantially two cascaded inverters. The first inverter is comprised of transistors MP1 and MN1. The inverse of the data presented at input node 14 appears at node 32 and node 34. The second inverter is comprised of output driver transistors MP4 and MN4. A twice-inverted representation of the data presented at input node 14 appears at output node 16 and is driven onto a conductor of bus 18.

When a logic low is presented at node 24 to enable driver circuit 10, nodes 26 and 30 are a logic high, and node 28 is a logic low. Node 30 being a logic high turns off transistor MP3 and turns on transistor MN2. Node 32 is isolated from power node 20 when transistor MP1 is in the off state and is pulled high, up to the potential of power node 20, when transistor MP1 is switched to the on state. In other words, whether node 32 is pulled high and thus whether transistor MP4 is turned off is dependent on the state of transistor MP1. Since the gate of transistor MN8 is coupled to input node 14, transistor MN8 will turn on when the data presented at input node 14 transitions high, and will turn off when the data presented at input node 14 transitions low.

Node 28 being a logic low turns transistor MP2 on and turns transistor MN3 off. Node 34 is isolated from reference potential 22 when transistor MN1 is in the off state and is pulled low, down to the potential of reference potential 22, when transistor MN1 is switched to the on state. In other words, whether node 34 is pulled low and thus whether transistor MN4 is switched to the off state is dependent on the state of transistor MN1. Since the gate of transistor MP8 is coupled to input node 14, transistor MP8 will turn on when the data presented at input node 14 transitions low, and will turn off when data presented at input node 14 transitions high.

Figure 2:
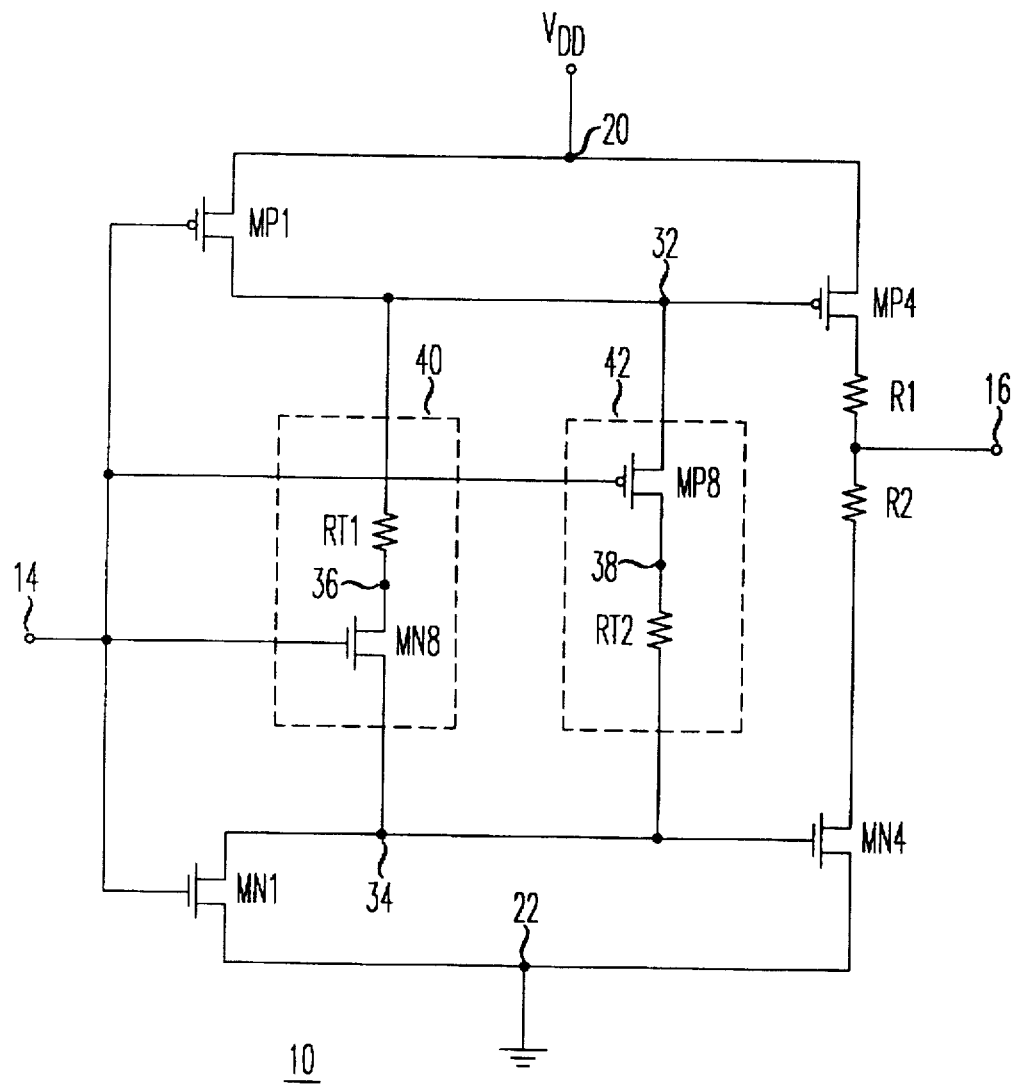
FIG. 2 is a simplified schematic diagram of the driver circuit of FIG. 1.

Operation of driver circuit 10 operating in the enabled, controlled transition time configuration is more readily understood with reference to the simplified schematic circuit shown in FIG. 2. The inverters of control logic 11 are not shown in FIG. 2. Transistors that remain in one state in the enabled, controlled transition time configuration, such as transistors MP3, MN3, MP10 and MN10 which remain in the off state, and transistors MN2 and MP2 which remain in the on state, are also not shown in FIG. 2.

In the enabled, controlled transition time configuration, data is being driven from input node 14 to output node 16 and onto a conductor of bus 18. The state of both transistors MN8 and MP8 is controlled by the state of node 14. The transition of each of transistors MN8 and MP8 from one state to another is initiated simultaneously by the state of and transition of the state of node 14. Nodes 32 and 34 are coupled to each other through first switching circuit 40 when node 14 is high and through second switching circuit 42 when node 14 is low. As node 14 transitions from one state to another, such as from high to low or from low to high, nodes 32 and 34 transition at different rates. The transition of output node 16 from one state to another is influenced by the dynamics of the characteristics of switching circuits 40 and 42. In the preferred embodiment, output node 16 transitioning from one state to another is more influenced by the dynamics of the characteristics of the switching circuit that has been switched on.

As node 14 transitions from high to low, transistor MN8 and hence switching circuit 40 turns off and transistor MP8 and hence switching circuit 42 turns on. Output node 16 transitions from a logic high to a logic low, and nodes 32 and 34 transition from a logic low to a logic high at different rates. When node 14 transitions from a logic high to a logic low, transistors MN1 and MN8 switch to be in the off state, rapidly isolating node 32 from reference potential 22. Transistors MP8 and MP1 switch to be in the on state, rapidly coupling node 38 and the gate of transistor MP4 to power node 20, thereby quickly turning transistor MP4 off. Although node 38 is rapidly coupled to the potential of power node 20, node 34 is charged up from the potential of reference potential 22 to the potential of power node 20 more slowly than node 38 is charged due to the time constant of the RC circuit comprised of resistor RT2 and the capacitance of node 34 which is dominated by the gate capacitance of output driver transistor MN4. Transistor MN4 turns on after transistor MP4 has turned off, and turns on more slowly with the presence of resistors RT2 due to the gate voltage reaching and crossing the turn-on threshold voltage of transistor MN4 more slowly than in the absence of resistors RT2. To facilitate rapidly changing the potential of node 38, it is preferable that the conduction path of switching transistor MP8 in second switching circuit 42 be between resistor RT2 and node 32. The conduction path of switching transistor MP2 is also preferably coupled between nodes 32 and 38. The rate at which transistor MN4 is turned on determines the fall time of node 16 and the data driven onto bus 18. The fall time can be controlled or changed by varying the resistance of resistor RT2.

As node 14 transitions from low to high, transistor MP8 and hence switching circuit 42 turns off and transistor MN8 and hence switching circuit 40 turns on. Output node 16 transitions from a logic low to a logic high and nodes 32 and 34 transition from a logic high to a logic low at different rates. When node 14 transitions from a logic low to a logic high, transistors MP1 and MP8 switch to be in the off state, rapidly isolating node 34 from power node 20. Transistors MN8 and MN1 switch to be in the on state, rapidly coupling node 36 and the gate of transistor MN4 to reference potential 22, thereby quickly turning transistor MN4 off.

Although node 36 is rapidly coupled to the potential of reference potential 22, node 32 is discharged from the potential of power node 20 to the potential of reference potential 22 more slowly than node 36 is discharged due to the time constant of the RC circuit comprised of resistor RT1 and the capacitance of node 32 which is dominated by the gate capacitance of output driver transistor MP4. Transistor MP4 turns on after transistor MN4 has turned off, and turns on more slowly with resistor RT1 present in the circuit due to the gate voltage reaching and crossing the turn-on threshold voltage of transistor MP4 more slowly than in the absence of resistor RT1. To facilitate rapidly changing the potential of node 36, it is preferable that the conduction path of switching transistor MN8 in first switching circuit 40 be between resistor RT1 and node 34. The conduction path of switching transistor MN2 is also preferably coupled between nodes 36 and 34. The rate at which transistor MP4 is turned on determines the rise time of node 16 and the data driven onto bus 18. The rise time can be controlled or changed by varying the resistance of resistor RT1. Preferably resistors RT1 and RT2 are tub resistors. Tub resistors are preferred due to less variation of resistance over process parameter variations.

It may be desirable for the rise time and fall time to differ, and thus the values of RT1 and RT2 may not be the same. The conductivity of an N-channel transistor differs from the conductivity of a similarly sized P-channel transistor which contributes to different resistance values. Providing resistors RT1 and RT2 in different switching circuits 40 and 42, respectively, provides independent control of the rise time and fall time. The output fall time is controlled by controlling the turning on of transistor MN4. Controlling turning on of transistor MN4 is achieved by controlling the charging of node 34 through switching circuit 42, more specifically through the resistor RT2 and switching transistors MP2 and MP8. The output rise time is controlled by controlling the turning on of transistor MP4. Controlling the turning on of transistor MP4 is achieved by controlling the discharging of node 32 through a switching circuit 40, specifically through the resistor RT1 and switching transistors MN2 and MN8.

Figure 3:
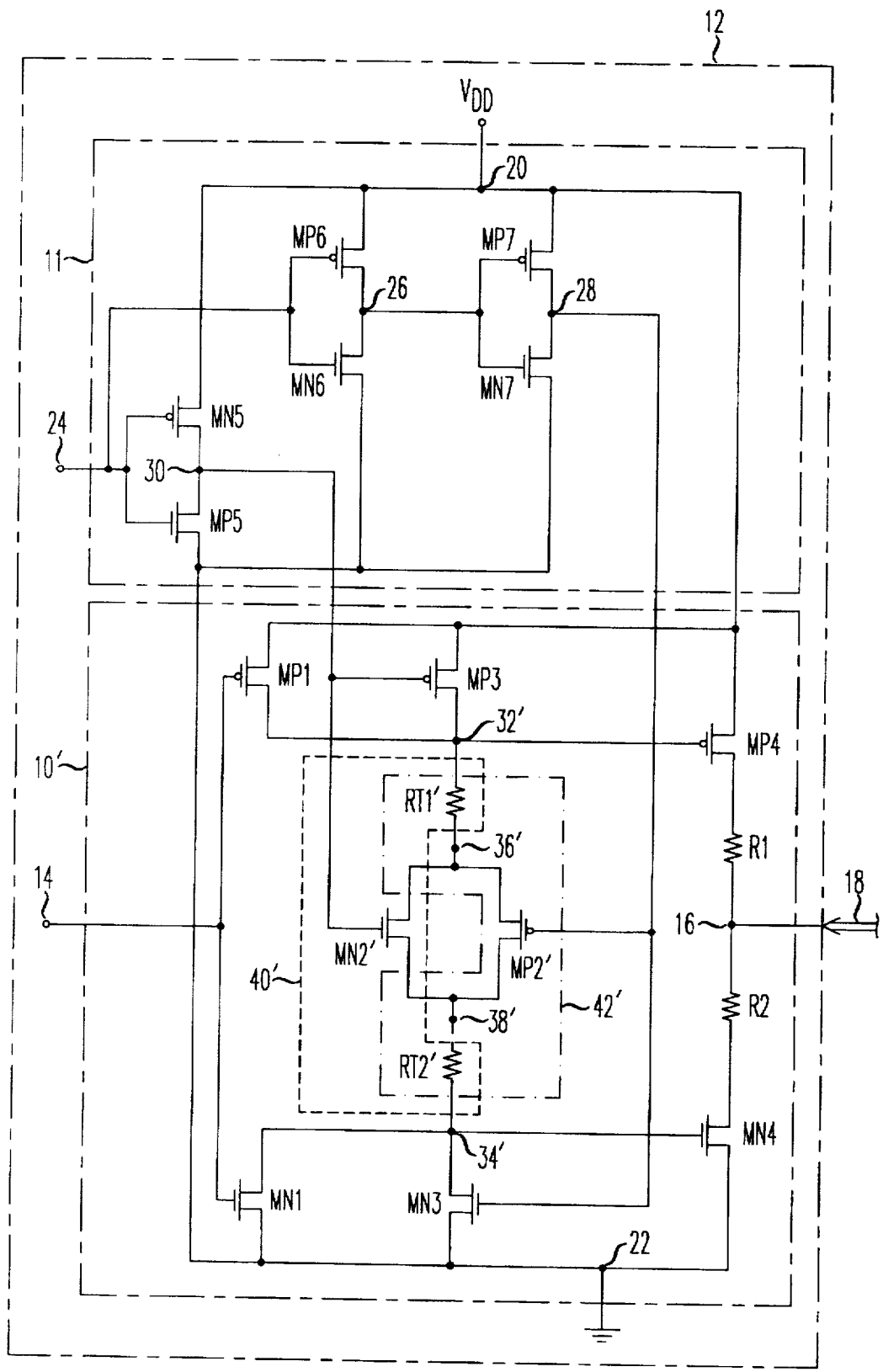
FIG. 3 is a schematic diagram of an integrated circuit including a driver circuit, that is an alternative illustrative embodiment of the invention.

An alternative illustrative embodiment of driver circuit 10' is shown in FIG. 3. In the alternative illustrative embodiment first and second, switching circuits 40 and 42 of FIGS. 1 and 2 are simplified to be first and second switching circuits 40' and 42'. Transistors MN2' and MP2' operate as a transmission switch with their conduction paths in parallel coupling nodes 36' and 38' when driver circuit 10' is enabled, and isolating node 36' from node 38' when driver circuit 10' is not enabled. In the alternative illustrative embodiment, the rise and fall times are not completely independent. The rise time is dependent on the discharging of node 32'. Transistor MP4 turns on more slowly with resistor RT2' present due to the time constant introduced by the resistance of resistor RT2', the on resistance of transistor MN2, and the gate capacitance of transistor MP4. The fall time is dependent on the charging of node 34'. Transistor MN4 turns on more slowly with resistor RT1' present due to the time constant introduced by the resistance of resistor RT1', the on resistance of transistor MP2 and the gate capacitance of transistor MN4.

While the illustrative embodiments of the invention have been described as using P-channel transistors (designated MP followed by a reference numeral) and N-channel transistors (designated MN followed by a reference numeral) being switched to on and off states by logic high and logic low signals, one skilled in the art could design a circuit to achieve the same function in which the logic states differ from those in the illustrative embodiment. Such designs are contemplated within the scope of the invention. Other variations in the circuit are possible. For example, transistors MP6 and MN6 (or alternatively MP5 and MN5) could be eliminated with node 30 (node 26) coupled to the gates of transistors MP7 and MN7 (gates of transistors MP3 and MN2). Other variations include using a characteristic in the first and second switching circuits other than a time constant, or using a time constant as the characteristic in the one switching circuit and a different characteristic in the other switching circuit.

While the illustrative embodiments of the invention have been described as a driver circuit useful for transferring data between an integrated circuit and a conductor of a bus, the invention is also applicable to a circuit that provides both input to an integrated circuit from a conductor of a bus, as well as output from an integrated circuit to a conductor of a bus. Furthermore, it is also contemplated as being within the scope of the invention that as levels of integration increase, e.g., more and more circuit functions are fabricated on a single integrated circuit chip, that all or part of the bus may be on the same integrated circuit chip as the driver circuit.

The invention claimed is:

1. An integrated circuit including an output driver circuit, the output driver circuit comprising:

first and second input transistors coupled to an input node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, first switching circuit comprising a resistor having a first magnitude, the first switching circuit switchable between a first state that isolates the first node from the second node and a second state that couples the first node to the second node, the first switching circuit exhibiting a characteristic, that upon being switched from one of the first and second states to the other, impacts turn-on time of one of the first and second output transistors; and a second switching circuit coupled between the first node and the second node, the second switching circuit switchable between a first state that isolates the first node from the second node and a second state that couples the first node to the second node, the second switching circuit exhibiting a characteristic that, upon being switched from one of the first and second states to the other, impacts turn-on time of the other of the first and second output transistors.

2. An integrated circuit as recited in claim 1, further comprising:

a control circuit switchable between a first state and a second state, the first state enabling transfer of data that is presented at the input node from the input node to the output node, and the second state preventing transfer of data from the input node to the output node.

3. An integrated circuit as recited in claim 1, wherein the characteristic exhibited by one of the first or second switching circuits is a time constant.

4. An integrated circuit as recited in claim 1, wherein the characteristic exhibited by the first switching circuit is the same characteristic as exhibited by the second switching circuit.

5. An integrated circuit as recited in claim 1, wherein one of the switching circuits is adapted to switch from its first state to its second state upon data received at the input node transitioning from low to high, and the other switching circuit is adapted to switch from its first state to its second state upon data received at the input node transitioning from high to low.

6. An integrated circuit as recited in claim 1, wherein the first switching circuit further comprises a first switching transistor.

7. An integrated circuit as recited in claim 1, wherein the second switching circuit is comprised of a resistor having a second magnitude, the second magnitude being different from the first magnitude.

8. An integrated circuit as recited in claim 6, wherein the first switching circuit further comprises a second switching transistor.

9. An integrated circuit including an output driver circuit, the output driver circuit comprising:

first and second input transistors coupled to an input node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, the first switching circuit switchable between a first state that isolates the first node from the second node and a second state that couples the first node to the second node, the first switching circuit exhibiting a characteristic, that upon being switched from one of the first and second states to the other, impacts turn-on time of one of the first and second output transistors, the first switching circuit comprising a first resistor having a magnitude, and a first switch capable of switching between first and second states, the first resistor coupled between the first node and the first switch, the first switch coupled between the first resistor and the second node; and a second switching circuit coupled between the first node and the second node, the second switching circuit switchable between a first state that isolates the first node from the second node and a second state that couples the first node to the second node, the second switching circuit exhibiting a characteristic that, upon being switched from one of the first and second states to the other, impacts turn-on time of the other of the first and second output transistors.

10. An integrated circuit including an output driver circuit, the output driver circuit comprising:

first and second input transistors coupled to an input node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, the first switching circuit switchable between a first state that isolates the first node from the second node and a second state that couples the first node to the second node, the first switching circuit exhibiting a characteristic, that upon being switched from one of the first and second states to the other, impacts turn-on time of one of the first and second output transistors; and a second switching circuit coupled between the first node and the second node, the second switching circuit switchable between a first state that isolates the first node from the second node and a second state that couples the first node to the second node, the second switching circuit exhibiting a characteristic that, upon being switched from one of the first and second states to the other, impacts turn-on time of the other of the first and second output transistors, the second switching circuit comprising a resistor having a magnitude, and a switch, the resistor coupled between the second node and the switch, the switch coupled between the resistor and the first node.

11. An integrated circuit as recited in claim 9, wherein the second switching circuit further comprises:

a second resistor having a magnitude, and a second switch capable of switching between first and second states, the second resistor coupled between the second node and the first switch, the second switch coupled in parallel with the first switch, the second switch being switched to the second state when the first switch is switched to the first state, and the second switch being switched to the first state when the first switch is switched to the second state.

12. An integrated circuit as recited in claim 9, wherein the second switching circuit further comprises:

a second resistor having a magnitude, and a second switch, the second resistor coupled between the second node and the second switch, the second switch coupled between the second resistor and the first node.

13. An integrated circuit as recited in claim 12, further comprising:

a bypass control circuit, the bypass control circuit including a first bypass control transistor having a conduction path coupled in parallel with the first resistor, and a second bypass control transistor having a conduction path coupled in parallel with the second resistor, the first and second bypass control transistors switchable between a first state in which the first and second bypass control transistors are in the off state, and a second state in which the first and second bypass control transistors are in the on state, whereby the conduction path of a respective bypass control transistor when in the on state provides a low impedance path, effectively eliminating the resistance of respective first and second resistors.

14. An integrated circuit including an output driver circuit, the output driver circuit comprising:

first and second input transistors coupled to an input node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, the first switching circuit switchable between a first state that isolates the first node from the second node and a second state that couples the first node to the second node, the first switching circuit exhibiting a characteristic, that upon being switched from the first state to the second state, impacts turn-on time of the second output transistor, the first switching circuit comprising a first resistor having a resistance that is a first magnitude; and a second switching circuit coupled between the first node and the second node, the second switching circuit switchable between a first state that isolates the first node from the second node and a second state that couples the first node to the second node, the second switching circuit exhibiting a characteristic that, upon being switched from the first state to the second state, impacts turn-on time of the first output transistor.

15. An integrated circuit as recited in claim 14, further comprising:

a control circuit switchable between a first state and a second state, the first state enabling transfer of data that is presented at the input node from the input node to the output node, and the second state preventing transfer of data from the input node to the output node.

16. An integrated circuit as recited in claim 14, wherein the characteristic exhibited by one of the first or second switching circuits is a time constant.

17. An integrated circuit as recited in claim 14, wherein the characteristic exhibited by the first switching circuit is the same characteristic as exhibited by the second switching circuit.

18. An integrated circuit as recited in claim 14, wherein one of the switching circuits is adapted to switch from its first state to its second state upon data received at the input node transitioning from low to high, and the other switching circuit is adapted to switch from its first state to its second state upon data received at the input node transitioning from high to low.

19. An integrated circuit as recited in claim 14, wherein the first switching circuit further comprises a first switching transistor.

20. An integrated circuit as recited in claim 14, wherein the second switching circuit is comprised of a second resistor having a resistance that is a second magnitude, the second magnitude being different from the first magnitude.

21. An integrated circuit as recited in claim 20, wherein the second switching circuit further comprises a second switching transistor.

22. An integrated circuit including an output driver circuit, the output driver circuit comprising:

first and second input transistors coupled to an node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, the first switching circuit switchable between a first state that isolates the first node from the second node and a second state that couples the first node to the second node, the first switching circuit exhibiting a characteristic, that upon being switched from the first state to the second state, impacts turn-on time of the second output transistor, the first switching circuit comprising a first resistor having a magnitude and a first switch capable of switching between first and second states, the first resistor coupled between the first node and the first switch, the first switch coupled between the first resistor and the second node; and a second switching circuit coupled between the first node and the second node, the second switching circuit switchable between a first state that isolates the first node from the second node and a second state that couples the first node to the second node, the second switching circuit exhibiting a characteristic that, upon being switched from the first state to the second state, impacts turn-on time of the first output transistor.

23. An integrated circuit including an output driver circuit, the output driver circuit comprising:

first and second input transistors coupled to an input node at which data is adapted to be received;

first and second output transistors coupled to an output node at which the data is adapted to be presented when the output driver is enabled, the first input transistor coupled to the first output transistor at a first node, the second input transistor coupled to the second output transistor at a second node;

a first switching circuit coupled between the first node and the second node, the first switching circuit switchable between a first state that isolates the first node from the second node and a second state that couples the first node to the second node, the first switching circuit exhibiting a characteristic, that upon being switched from the first state to the second state, impacts turn-on time of the second output transistor;

a second switching circuit coupled between the first node and the second node, the second switching circuit switchable between a first state that isolates the first node from the second node and a second state that couples the first node to the second node, the second switching circuit exhibiting a characteristic that, upon being switched from the first state to the second state, impacts turn-on time of the first output transistor, the second switching circuit comprising a first resistor having a magnitude, and a first switch, the first resistor coupled between the second node and the first switch, the first switch coupled between the first resistor and the first node.

24. An integrated circuit as recited in claim 23, wherein the second switching circuit further comprises:

a second resistor having a magnitude, and a second switch capable of switching between first and second state, the second resistor coupled between the second node and the first switch, the second switch coupled in parallel with the first switch, the second switch being switched to the second state when the first switch is switched to the first state, and the second switch being switched to the first state when the first switch is switched to the second state.

25. An integrated circuit as recited in claim 22, wherein the second switching circuit further comprises:

a second resistor having a magnitude, and a second switch, the second resistor coupled between the second node and the second switch, the second switch coupled between the second resistor and the first node.

26. An integrated circuit as recited in claim 25, further comprising:

a bypass control circuit, the bypass control circuit including a first bypass control transistor having a conduction path coupled in parallel with the first resistor, and a second bypass control transistor having a conduction path coupled in parallel with the second resistor, the first and second bypass control transistors switchable between a first state in which the first and second bypass control transistors are in the off state, and a second state in which the first and second bypass control transistors are in the on state, whereby the conduction path of a respective bypass control transistor when in the on state provides a low impedance path, effectively eliminating the resistance of respective first and second resistors.

27. An integrated circuit, including an output driver circuit, the output driver circuit comprising:

first and second input transistors coupled to an input node at which data is adapted to be received, each of the first and second input transistors having first and second terminals, the first terminal of each of the first and second input transistors coupled to the input node;

first and second output transistors coupled to an output node at which the data is adapted to be presented, each of the first and second output transistors having first and second terminals, the first terminal of each of the first and second output transistors coupled to the output node, the second terminal of the first input transistor coupled to the second terminal of the first output transistor defining a first node, the second terminal of the second input transistor coupled to the second terminal of the second output transistor defining a second node;

a first switching circuit coupled between the first and second nodes, the first switching circuit comprising a first resistor having a magnitude, and a first switch, the first resistor coupled between the first node and the first switch, the first switch coupled between the first resistor and the second node, the first switch capable of being switched from a first state that isolates the first node from the second node to a second state that couples the first node to the second node, the first switching circuit exhibiting a characteristic, that upon being switched from the first state to the second state, impacts turn-on time of the second output transistor; and a second switching circuit coupled between the first and second nodes, the second switching circuit comprising a second resistor having a magnitude, and a second switch, the second resistor coupled between the second node and the second switch, the second switch coupled between the second resistor and the first node, the second switch capable of being switched from a first state that isolates the first node from the second node to a second state that couples the first node to the second node, the second switching circuit exhibiting a characteristic that, upon being switched from the first state to the second state, impacts turn-on time of the first output transistor.

28. An integrated circuit as recited in claim 27, further comprising:

a control circuit switchable between a first state and a second state, the first state enabling transfer of data that is presented at the input node from the input node to the output node, and the second state preventing transfer of data from the input node to the output node.

29. An integrated circuit as recited in claim 27, wherein the characteristic exhibited by one of the first or second switching circuits is a time constant.

30. An integrated circuit as recited in claim 27, wherein one of the switching circuits is adapted to switch from its first state to its second state upon data received at the input node transitioning from low to high, and the other switching circuit is adapted to switch from its first state to its second state upon data received.

31. An integrated circuit as recited in claim 27, further comprising:

a bypass control circuit, the bypass control circuit including a first bypass control transistor having a conduction path coupled in parallel with the first resistor, and a second bypass control transistor having a conduction path coupled in parallel with the second resistor, the first and second bypass control transistors switchable between a first state in which the first and second bypass control transistors are in the off state, and a second state in which the first and second bypass control transistors are in the on state, whereby the conduction path of a respective bypass control transistor when in the on state provides a low impedance path, effectively eliminating the resistance of respective first and second resistors.

32. An integrated circuit as recited in claim 9, further comprising:

a bypass control circuit, the bypass control circuit including a bypass control transistor having a conduction path coupled in parallel with the first resistor, the bypass control transistor switchable between a first state in which the bypass control transistor is in an off state, and a second state in which the bypass control transistor is in an on state, whereby the conduction path of the bypass control transistor when in one of said states provides a lower impedance path, effectively eliminating the resistance of the first resistor.

* * * * *